United States Patent
Behzad et al.

(10) Patent No.: US 7,340,220 B2
(45) Date of Patent: Mar. 4, 2008

(54) PHASE LOCKED LOOP WITH POWER DISTRIBUTION

(75) Inventors: Arya Reza Behzad, Poway, CA (US); Hung-Ming Ed Chien, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 385 days.

(21) Appl. No.: 11/184,423

(22) Filed: Jul. 19, 2005

(65) Prior Publication Data
US 2006/0223473 A1 Oct. 5, 2006

Related U.S. Application Data

(60) Provisional application No. 60/666,126, filed on Mar. 29, 2005.

(51) Int. Cl.
*H04B 1/40* (2006.01)
(52) U.S. Cl. .................. 455/76; 455/260; 375/376
(58) Field of Classification Search .............. None
See application file for complete search history.

(56) References Cited

U.S. PATENT DOCUMENTS

| 5,794,130 | A | * | 8/1998 | Abe et al. ............... 455/76 |
| 6,163,186 | A | * | 12/2000 | Kurita ................... 375/376 |
| 6,342,819 | B1 | * | 1/2002 | Yamada ................. 455/260 |

OTHER PUBLICATIONS

"A Single-Chip Digitally Calibrated 5.15-5.825-GHz 0.18-um CMOS Transceiver for 802.11a Wireless LAN" by Vassiliou, et al, IEEE Journal of Solid-State Circuit vol. 38, No. 12, Dec. 2003.
"A Single-Chip Dual-Band Tri-Mode CMOS Transceiver for IEEE 802.11a/b/g WLAN" by Zargari, et al, ISSCC 2004/Session 5/WLAN Transceivers/5.4;2004 IEEE International Solid-State Circuits Conference.

* cited by examiner

*Primary Examiner*—Thanh Cong Le
(74) *Attorney, Agent, or Firm*—Garlick Harrison & Markison; Timothy W. Markison

(57) ABSTRACT

A phase locked loop includes a detection module, a control conversion module, a controlled oscillation module, a divider module, and a power distribution module. The detection module is operably coupled to produce a difference signal based on a difference between a reference oscillation and a feedback oscillation. The control conversion module is operably coupled to convert the difference signal into a control signal. The controlled oscillation module is operably coupled to produce an output oscillation based on the control signal. The divider module is operably coupled to produce the feedback oscillation based on the output oscillation. The power distribution module is operably coupled to receive a supply voltage and to provide an individual supply voltage to at least one of the detection module, the control conversion module, the controlled oscillation module, and the divider module to optimize at least one of performance and power consumption of the phase locked loop.

19 Claims, 8 Drawing Sheets

PHASE LOCKED LOOP WITH POWER DISTRIBUTION

CROSS REFERENCE TO RELATED PATENTS

This invention is claiming priority under 35 USC § 119(e) to a provisionally filed patent application having the same title as the present patent application, a filing date of Mar. 29, 2005 and an application No. of 60/666,126.

BACKGROUND OF THE INVENTION

1. Technical Field of the Invention

This invention relates generally to mixed signal circuitry and more particularly to clocking circuits that may be used within a wireless communication device.

2. Description of Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna.

As is also known, the receiver is coupled to the antenna and includes a low noise amplifier, one or more intermediate frequency stages, a filtering stage, and a data recovery stage. The low noise amplifier receives inbound RF signals via the antenna and amplifies then. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

As is further known, the local oscillation generator produces the local oscillations of the transmitter section and receiver section. Typically, the local oscillation generator includes a phase locked loop to produce an output oscillation from a reference oscillation. One known embodiment of a local oscillation generator includes a buffer, or multiple buffers, coupled to the output of the phase locked loop to produce the local oscillations for the transmitter section and the receiver section. Another known embodiment of a local oscillation includes a divide by two module and a summation module to produce the local oscillations. In this embodiment, the divide by two module divides the frequency of the output oscillation by two to produce a one-half output oscillation. The summation module sums the output oscillation with the one-half output oscillation to produce an oscillation at the desired frequency of the local oscillations.

As is also known, noise generated within the local oscillation generator is propagated throughout the transmitter section and the receiver section. As such, great care is taken to reduce the noise generated by the local oscillation generator and the phase locked loop contained therein. For instance, many local oscillation generators include differential signaling to reduce the adverse affects of common mode supply noise. In addition, the power supply sourcing the phase locked loop may include filtering to reduce of the adverse affects of supply voltage noise. While each of these techniques reduces the noise produced by a local oscillation generator, there is still room for improvement.

Therefore, a need exists for a phase locked loop with distributed power to reduce noise therein and, if used in a local oscillation generator, to reduce the noise of the local oscillation generator.

BRIEF SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

DETAILED DESCRIPTION OF THE INVENTION

Figure 1:
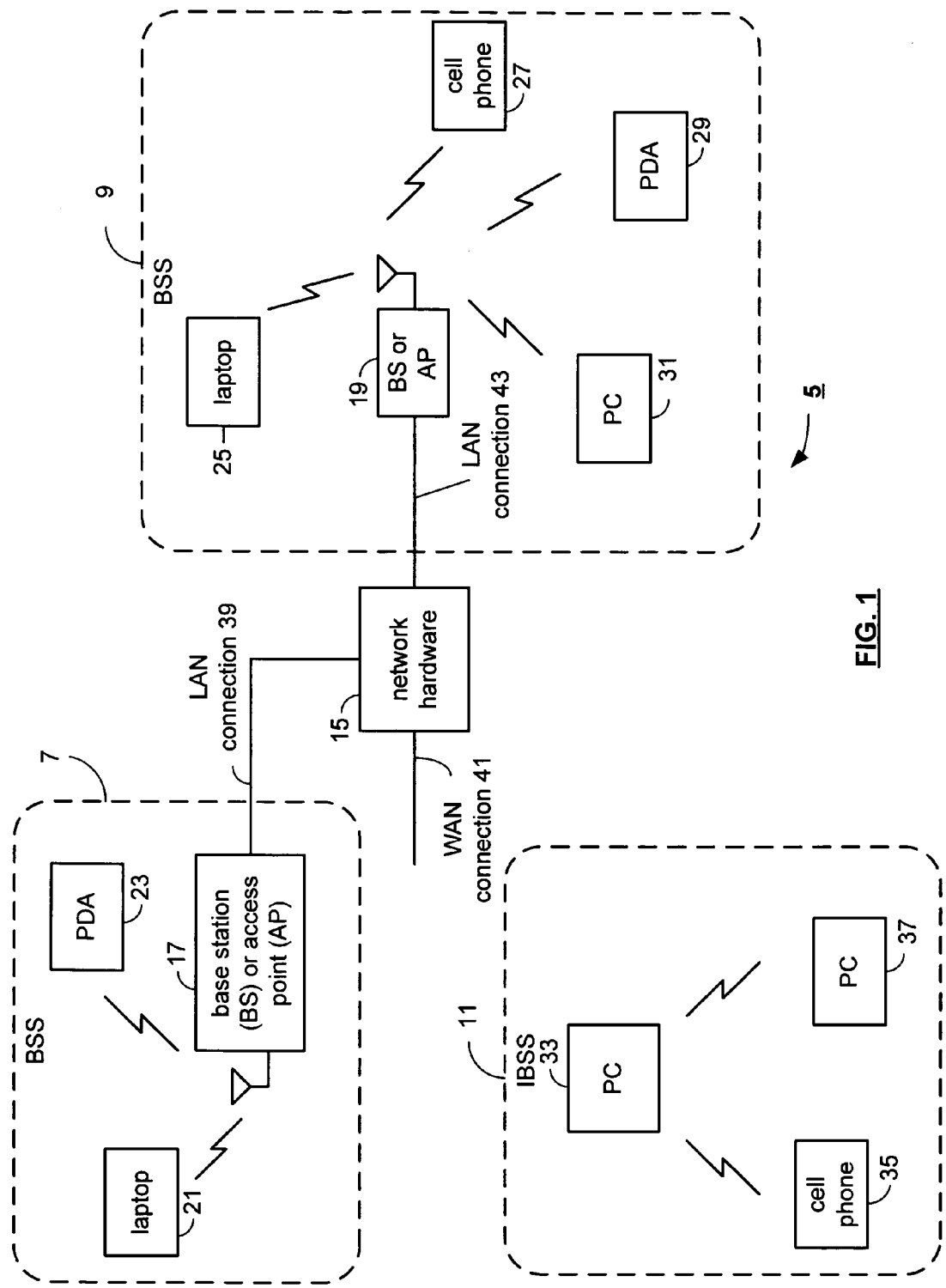
FIG. 1 is a schematic block diagram of a wireless communication system in accordance with the present invention.

FIG. 1 illustrates a schematic block diagram of a communication system 5 that includes basic service set (BSS) areas 7 and 9, an independent basic service set (IBSS) 11, and a network hardware device 15. Each of the BSS areas 7 and 9 include a base station and/or access point 17, 19 and a plurality of wireless communication devices 21-23, 25-31. The IBSS 11 includes a plurality of wireless communication devices 33-37. Each of the wireless communication devices 21-37 may be laptop host computers 21 and 25, personal digital assistant hosts 23 and 29, personal computer hosts 31 and 33 and/or cellular telephone hosts 27 and 35.

The base stations or access points 17 and 19 are operably coupled to the network hardware 15 via local area network connections 39 and 43. The network hardware 15, which may be a router, switch, bridge, modem, system controller, et cetera provides a wide area network connection 41 for the communication system 5. Each of the base stations or access points 17, 19 has an associated antenna or antenna array to communicate with the wireless communication devices in its area. Typically, the wireless communication devices register with a particular base station or access point 17, 19 to receive services from the communication system 5. For direct connections (i.e., point-to-point communications) within IBSS 11, wireless communication devices 33-37 communicate directly via an allocated channel.

Typically, base stations are used for cellular telephone systems and like-type systems, while access points are used for in-home or in-building wireless networks. Regardless of the particular type of communication system, each wireless communication device includes a built-in radio transceiver and/or is coupled to a radio transceiver to facilitate direct and/or in-direct wireless communications within the communication system 5.

Figure 2:
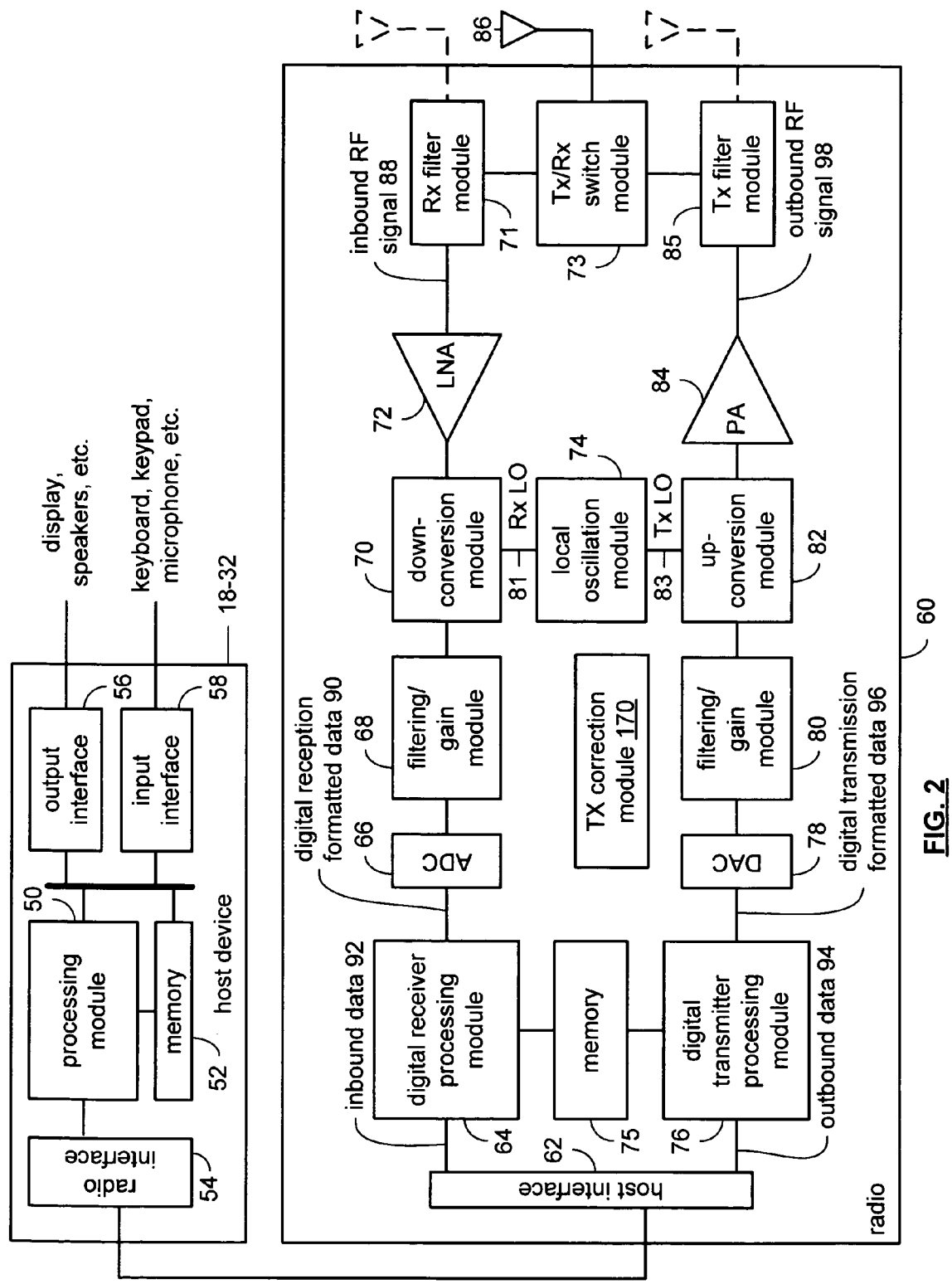
FIG. 2 is a schematic block diagram of a wireless communication device in accordance with the present invention.

FIG. 2 illustrates a schematic block diagram of a wireless communication device that includes the host device 18-32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18-32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera such that the received data may be displayed. The radio interface 54 also provides data from the processing module 50 to the radio 60. The processing module 50 may receive the outbound data from an input device such as a keyboard, keypad, microphone, et cetera via the input interface 58 or generate the data itself. For data received via the input interface 58, the processing module 50 may perform a corresponding host function on the data and/or route it to the radio 60 via the radio interface 54.

Radio 60 includes a host interface 62, digital receiver processing module 64, analog-to-digital converter 66, filtering/gain module 68, down conversion module 70, low noise amplifier 72, local oscillation module 74, memory 75, digital transmitter processing module 76, digital-to-analog converter 78, filtering/gain module 80, up-conversion module 82, power amplifier 84, and an antenna 86. The antenna 86 may be a single antenna that is shared by the transmit and receive paths or may include separate antennas for the transmit path and receive path. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64 and/or 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE802.11a, IEEE802.11b, Bluetooth, et cetera) to produce digital transmission formatted data 96. The digital transmission formatted data 96 will be a digital base-band signal or a digital low IF signal, where the low IF will be in the frequency range of zero to a few megahertz.

The digital-to-analog converter 78 converts the digital transmission formatted data 96 from the digital domain to the analog domain. The filtering/gain module 80 filters and/or adjusts the gain of the analog signal prior to providing it to the up-conversion module 82. The up-conversion module 82 directly converts the analog baseband or low IF signal into an RF signal based on a transmitter local oscillation provided by local oscillation module 74. The power amplifier 84, which may include the highly linear power amplifier discussed in FIG. 9 and/or the programmable power amplifier discussed in FIGS. 3-7, amplifies the RF signal to produce outbound RF signal 98. The antenna 86 transmits the outbound RF signal 98 to a targeted device such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the low noise amplifier 72, which amplifies the signal 88 to produce an amplified inbound RF signal. The low noise amplifier 72 provide the amplified inbound RF signal to the down conversion module 70, which directly converts the amplified inbound RF signal into an inbound low IF signal based on a receiver local oscillation provided by local oscillation module 74. The down conversion module 70 provides the inbound low IF signal to the filtering/gain module 68, which filters and/or adjusts the gain of the signal before providing it to the analog to digital converter 66.

The analog-to-digital converter 66 converts the filtered inbound low IF signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 18-32 via the radio interface 54.

Figure 3:
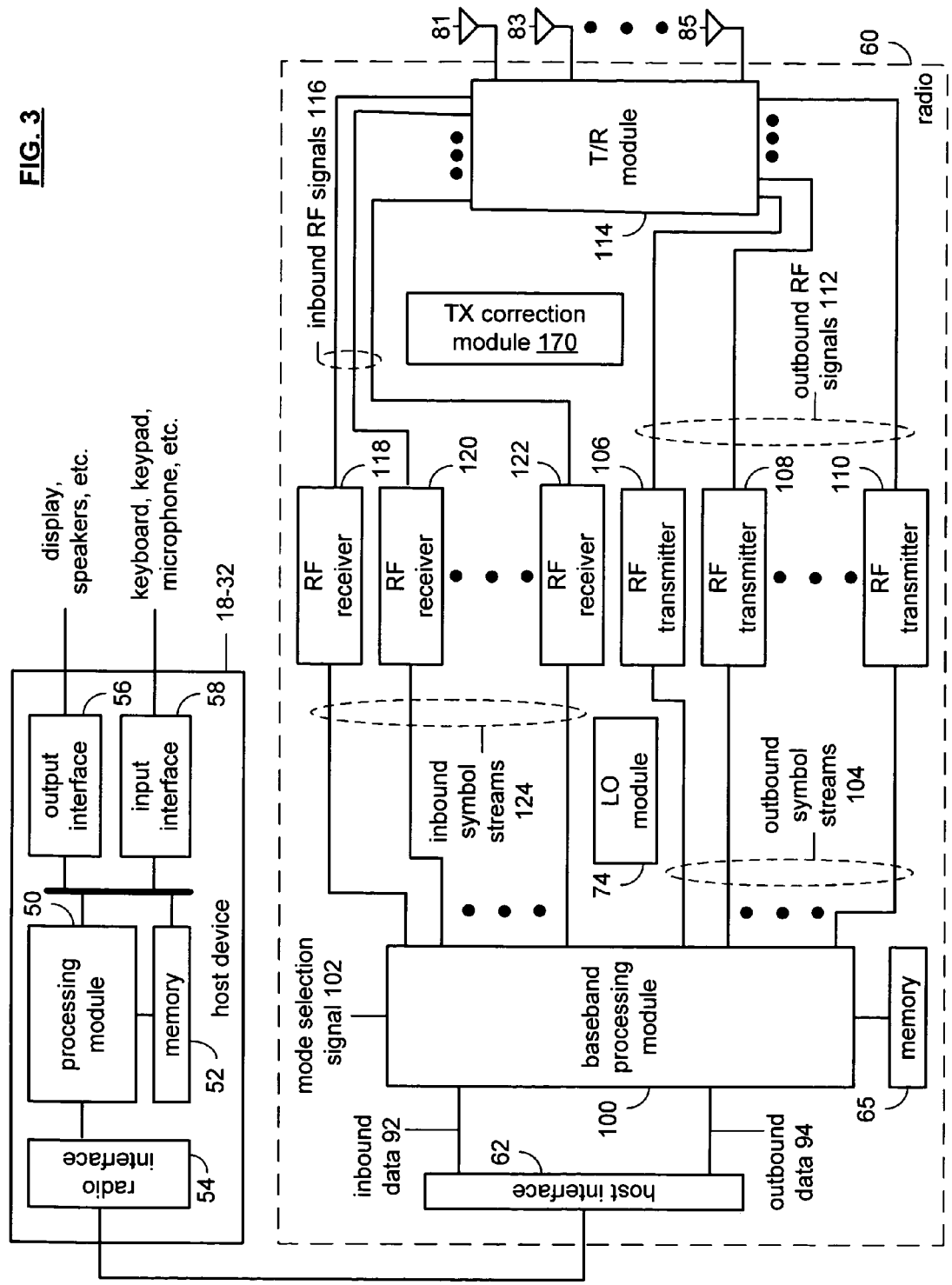
FIG. 3 is a schematic block diagram of another wireless communication device in accordance with the present invention.

FIG. 3 is a schematic block diagram illustrating a wireless communication device that includes the host device 18-32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18-32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera such that the received data may be displayed. The radio interface 54 also provides data from the processing module 50 to the radio 60. The processing module 50 may receive the outbound data from an input device such as a keyboard, keypad, microphone, et cetera via the input interface 58 or generate the data itself. For data received via the input interface 58, the processing module 50 may perform a corresponding host function on the data and/or route it to the radio 60 via the radio interface 54.

Radio 60 includes a host interface 62, a baseband processing module 100, memory 65, a plurality of radio frequency (RF) transmitters 106-110, a transmit/receive (T/R) module 114, a plurality of antennas 81-85, a plurality of RF receivers 118-120, a channel bandwidth adjust module 87, and a local oscillation module 74. The baseband processing module 100, in combination with operational instructions stored in memory 65, executes digital receiver functions and digital transmitter functions, respectively. The digital receiver functions include, but are not limited to, digital intermediate frequency to baseband conversion, demodulation, constellation demapping, decoding, de-interleaving, fast Fourier transform, cyclic prefix removal, space and time decoding, and/or descrambling. The digital transmitter functions include, but are not limited to, scrambling, encoding, interleaving, constellation mapping, modulation, inverse fast Fourier transform, cyclic prefix addition, space and time encoding, and digital baseband to IF conversion. The baseband processing modules 100 may be implemented using one or more processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 65 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 100 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 94 from the host device via the host interface 62. The baseband processing module 64 receives the outbound data 88 and, based on a mode selection signal 102, produces one or more outbound symbol streams 90. The mode selection signal 102 will indicate a particular mode of operation that is compliant with one or more specific modes of the various IEEE 802.11 standards. For example, the mode selection signal 102 may indicate a frequency band of 2.4 GHz, a channel bandwidth of 20 or 22 MHz and a maximum bit rate of 54 megabits-per-second. In this general category, the mode selection signal will further indicate a particular rate ranging from 1 megabit-per-second to 54 megabits-per-second. In addition, the mode selection signal will indicate a particular type of modulation, which includes, but is not limited to, Barker Code Modulation, BPSK, QPSK, CCK, 16 QAM and/or 64 QAM. The mode select signal 102 may also include a code rate, a number of coded bits per subcarrier (NBPSC), coded bits per OFDM symbol (NCBPS), and/or data bits per OFDM symbol (NDBPS). The mode selection signal 102 may also indicate a particular channelization for the corresponding mode that provides a channel number and corresponding center frequency. The mode select signal 102 may further indicate a power spectral density mask value and a number of antennas to be initially used for a MIMO communication.

The baseband processing module 100, based on the mode selection signal 102 produces one or more outbound symbol streams 104 from the outbound data 94. For example, if the mode selection signal 102 indicates that a single transmit antenna is being utilized for the particular mode that has been selected, the baseband processing module 100 will produce a single outbound symbol stream 104. Alternatively, if the mode select signal 102 indicates 2, 3 or 4 antennas, the baseband processing module 100 will produce 2, 3 or 4 outbound symbol streams 104 from the outbound data 94.

Depending on the number of outbound streams 104 produced by the baseband module 10, a corresponding number of the RF transmitters 106-110 will be enabled to convert the outbound symbol streams 104 into outbound RF signals 112. In general, each of the RF transmitters 106-110 includes a digital filter and upsampling module, a digital to analog conversion module, an analog filter module, a frequency up conversion module, a power amplifier, and a radio frequency bandpass filter. The RF transmitters 106-110 provide the outbound RF signals 112 to the transmit/receive module 114, which provides each outbound RF signal to a corresponding antenna 81-85.

When the radio 60 is in the receive mode, the transmit/receive module 114 receives one or more inbound RF signals 116 via the antennas 81-85 and provides them to one or more RF receivers 118-122, which will be described in greater detail with reference to FIG. 4. The RF receiver 118-122, based on settings provided by the channel bandwidth adjust module 87, converts the inbound RF signals 116 into a corresponding number of inbound symbol streams 124. The number of inbound symbol streams 124 will correspond to the particular mode in which the data was received. The baseband processing module 100 converts the inbound symbol streams 124 into inbound data 92, which is provided to the host device 18-32 via the host interface 62.

As one of average skill in the art will appreciate, the wireless communication device of FIG. 3 may be implemented using one or more integrated circuits. For example, the host device may be implemented on one integrated circuit, the baseband processing module 100 and memory 65 may be implemented on a second integrated circuit, and the remaining components of the radio 60, less the antennas 81-85, may be implemented on a third integrated circuit. As an alternate example, the radio 60 may be implemented on a single integrated circuit. As yet another example, the processing module 50 of the host device and the baseband processing module 100 may be a common processing device implemented on a single integrated circuit. Further, the memory 52 and memory 65 may be implemented on a single integrated circuit and/or on the same integrated circuit as the common processing modules of processing module 50 and the baseband processing module 100.

Figure 4:
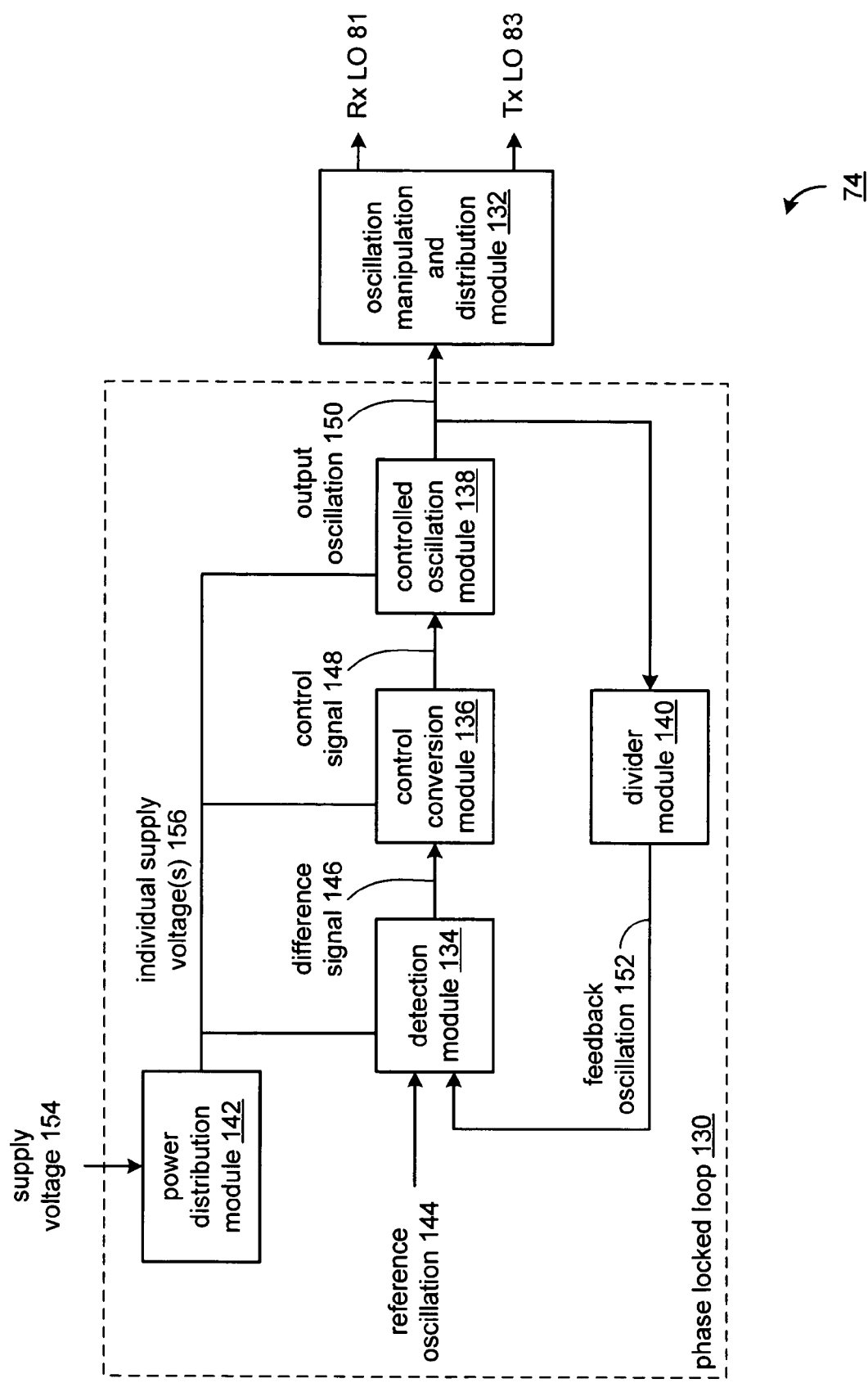
FIG. 4 is a schematic block diagram of a local oscillation module in accordance with the present invention.

FIG. 4 is a schematic block diagram of a local oscillation module 74 that includes a phase locked loop 130 and an oscillation manipulation and distribution module 132. The phase locked loop 130 includes a detection module 134, a control conversion module 136, a controlled oscillation module 138, a divider module 140, and a power distribution module 142.

In operation, the detection module 134 compares a reference oscillation 144 with a feedback oscillation 152 to produce a different signal 146. The detection module 134 may be a phase and/or frequency detection module that detects a phase and/or frequency difference between the reference oscillation 144 and the feedback oscillation 152. The difference signal 146 represents the phase and/or frequency difference between the reference oscillation 144 and the feedback oscillation 152.

The control conversion module 136 converts the different signal 146 into a control signal 148. The control conversion module 136 may be an analog circuit and/or digital circuit that converts a voltage or current representation of the different signal 146 into a voltage or current representation of control signal 148. In one embodiment, the control conversion module 136 includes a charge pump and a loop filter.

The controlled oscillation module 138, which may be a voltage or current controlled oscillator, produces an output oscillation 150 based on control signal 148. The divider module 140 divides the frequency of the output oscillation 150 to produce the feedback oscillation 152, which is provided to the detection module.

The power distribution module 142 receives a power supply voltage 154, which may be generated on-chip or off-chip, and produces there from at least one individual supply voltage 156. The power distribution module 142, which will be described in greater detail with reference to FIGS. 5-9, provides the individual supply voltage 156 to one or more of the detection module 134, the control conversion module 136 and the controlled oscillation module 138. In general, by providing an individual supply voltage 156 to one or more of modules 134, 136 and 138, the adverse affects of power supply noise and/or noise coupled from one module to another via the power supply lines is substantially reduced. As such, by reducing noise within the phase locked loop, noise within local oscillation module 74 is reduced thereby providing a more reliable RF transceiver.

The oscillation manipulation and distribution module 132 receives the output oscillation 150 and produces there from the receiver local oscillation 81 and the transmit local oscillation 83. In one embodiment, the oscillation module 132 may include a pair of buffers, where the $1^{st}$ buffer buffers the output oscillation 150 to produce the receive local oscillation 81 and the $2^{nd}$ buffer buffers the output oscillation 150 to produce the transmit local oscillation 83. In another embodiment, the oscillation module 132 includes a divide-by-two module, a summing module and a pair of buffers. The divide-by-two module divides the frequency of the output oscillation 150 by a factor of 2 to produce a one-half output oscillation. The summation module sums the output oscillation 150 with the one-half output oscillation to produce an oscillation at the desired frequency at the local oscillation. The buffers buffer the summed oscillation to produce the receive local oscillation 81 and transmit local oscillation 83, respectfully.

Figure 5:
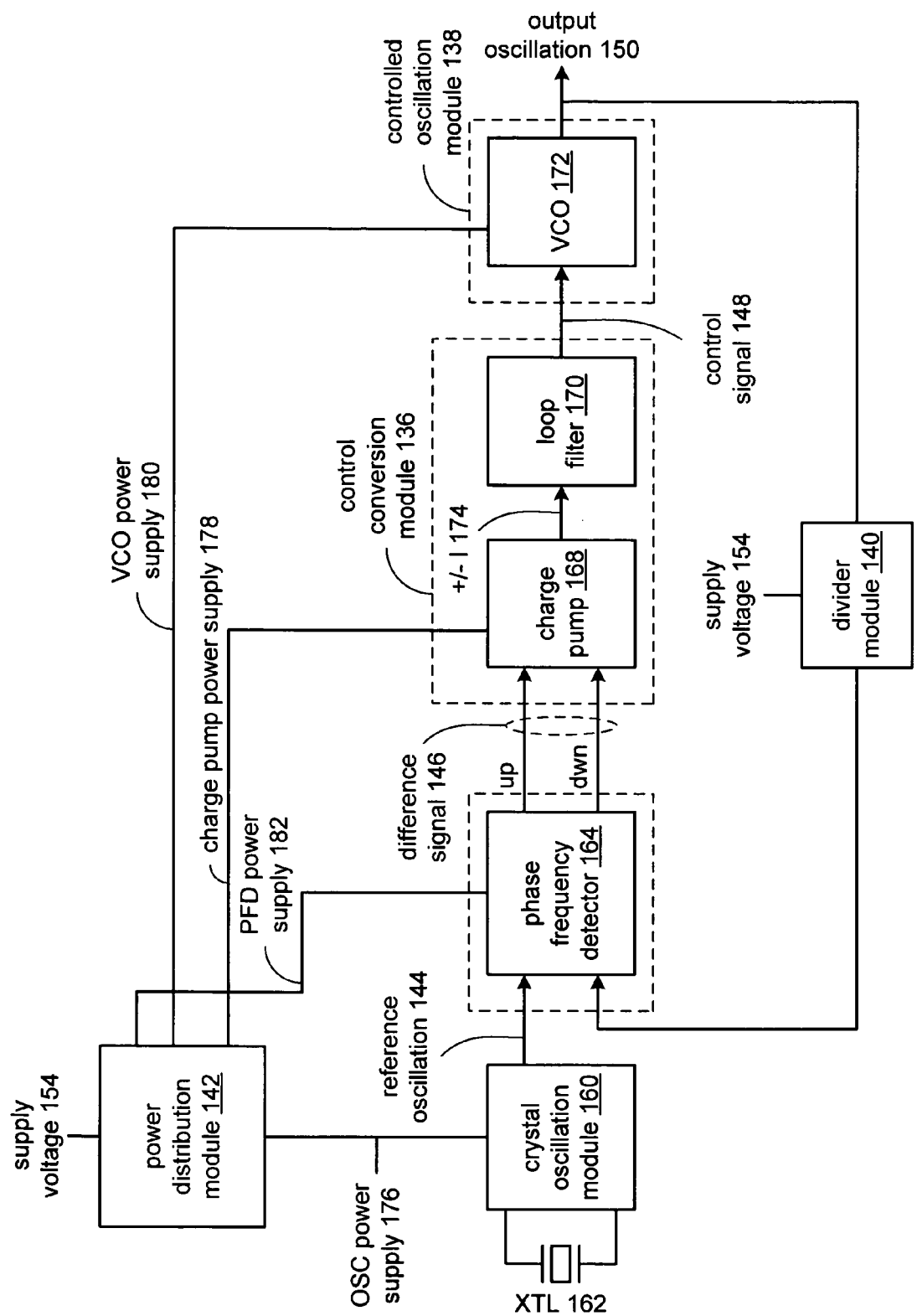
FIG. 5 is a schematic block diagram of a phase locked loop in accordance with the present invention.

FIG. 5 is a schematic block diagram of another embodiment of phase locked loop 130 that includes the power distribution module 142, a phase and frequency detector 164, a charge pump 168, a loop filter 170, a voltage controlled oscillator 172, the divider module 140, and a crystal oscillation module 160. The crystal oscillation module 160 is operably coupled to a crystal 162, which may be external to the integrated circuit, to produce the reference oscillation 144. The crystal oscillation module 16 may be separately powered from the power distribution module 142 via an individual power supply (OSC power supply 176).

The phase and frequency detector 164, which may be used for the detection module 134, compares the phase and frequency of the reference oscillation 144 with the phase and frequency of the feedback oscillation 152 to produce an up-signal and/or down-signal as the different signal 146. The up-signal is produced when the output oscillation 150 is too slow indicating that the phase and/or frequency the reference oscillation 144 is leading the feedback oscillation. The phase and frequency detector 164 produces the down-signal when the output oscillation 150 is too fast indicating that the phase and/or frequency of the feedback oscillation 152 is leading the reference oscillation 144. The phase and frequency detector 164 may be separately powered by the power distribution module 142 via an individual power supply labeled as phase frequency detector (PFD) power supply voltage 182.

The charge pump 168 and loop filter 170 comprise the control conversion module 136. In this embodiment, the charge pump 168 receives the up-signal and down-signal and produces an up-current or down-current (+/−I 174). The loop filter 170 converts the up or down-current 174 into the control signal 148. The charge pump power supply 178 may be separately powered by the power distribution module 142 via an individual power supply labeled as charge pump power supply 178.

The voltage controlled oscillator 172 converts the control signal 148 into the output oscillation 150. In this embodiment, the voltage controlled oscillator 172 is functioning as the controlled oscillation module 138. The voltage controlled oscillator 172 may be separately powered by the power distribution module 142 via an individual power supply labeled VCO power supply 180.

As shown, the power distribution module 142 produces a plurality of individual supply voltages 176, 178, 180 and 182 from the supply voltage 154. Each of the individual supply voltages 176-182 may be from the same voltage source with separate filtering, may be from different voltage sources with separate filtering and/or a combination thereof.

Figure 6:
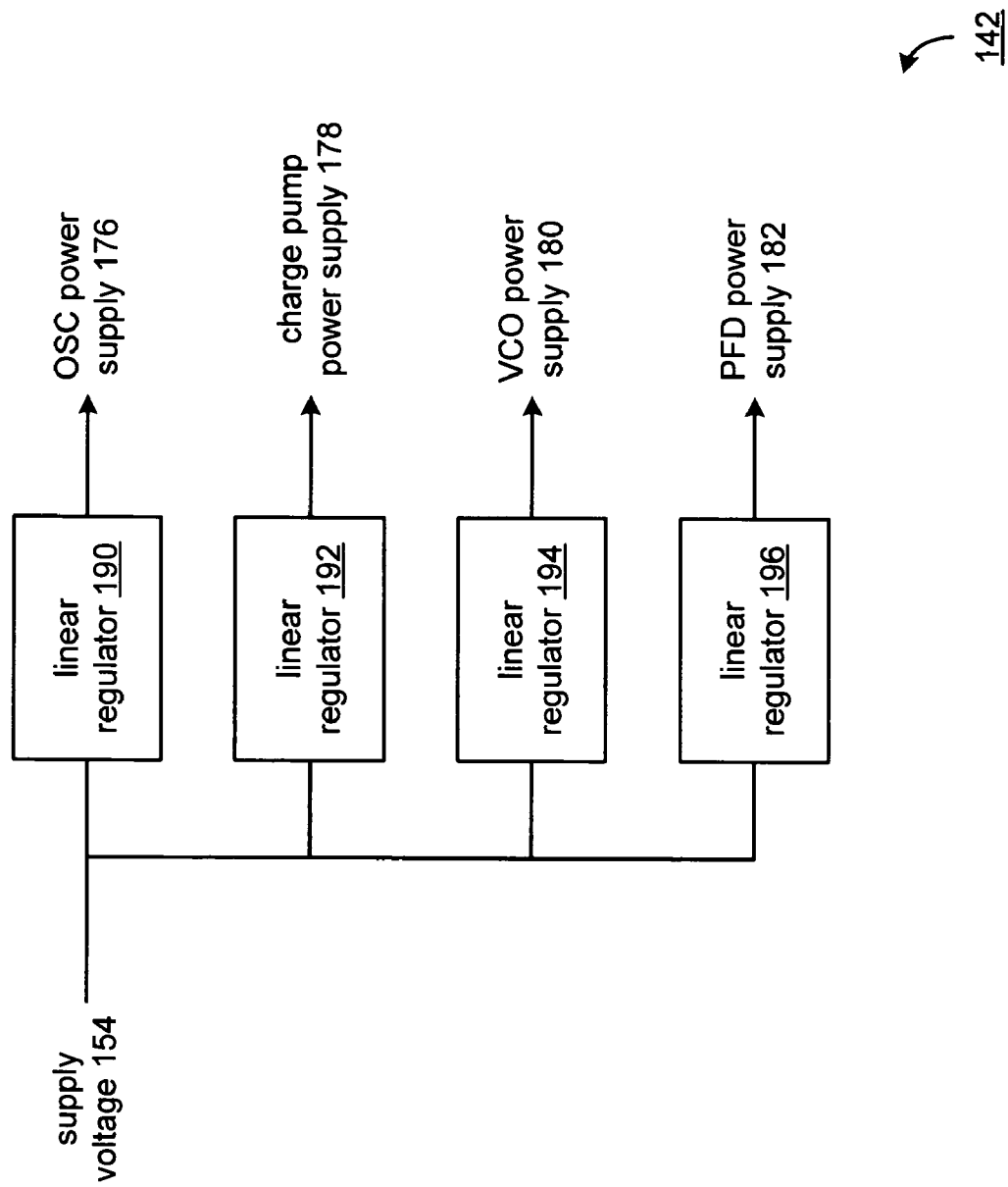
FIG. 6 is a schematic block diagram of a power distribution module in accordance with the present invention.

FIG. 6 is a schematic block diagram of the power distribution module 142 that includes a plurality of linear regulators 190-196. As shown, each of the linear regulators 190-196 converts the power supply voltage 154 into a corresponding one of the individual supply voltages 176-182. By having separate linear regulators for each of the individual supply voltages, noise produced by the circuits being driven by the linear regulators is not propagated via the supply lines to the other modules within the phase locked loop thereby reducing noise within the phase locked loop. Further, power supply noise is reduced with the phase locked loop.

Figure 7:
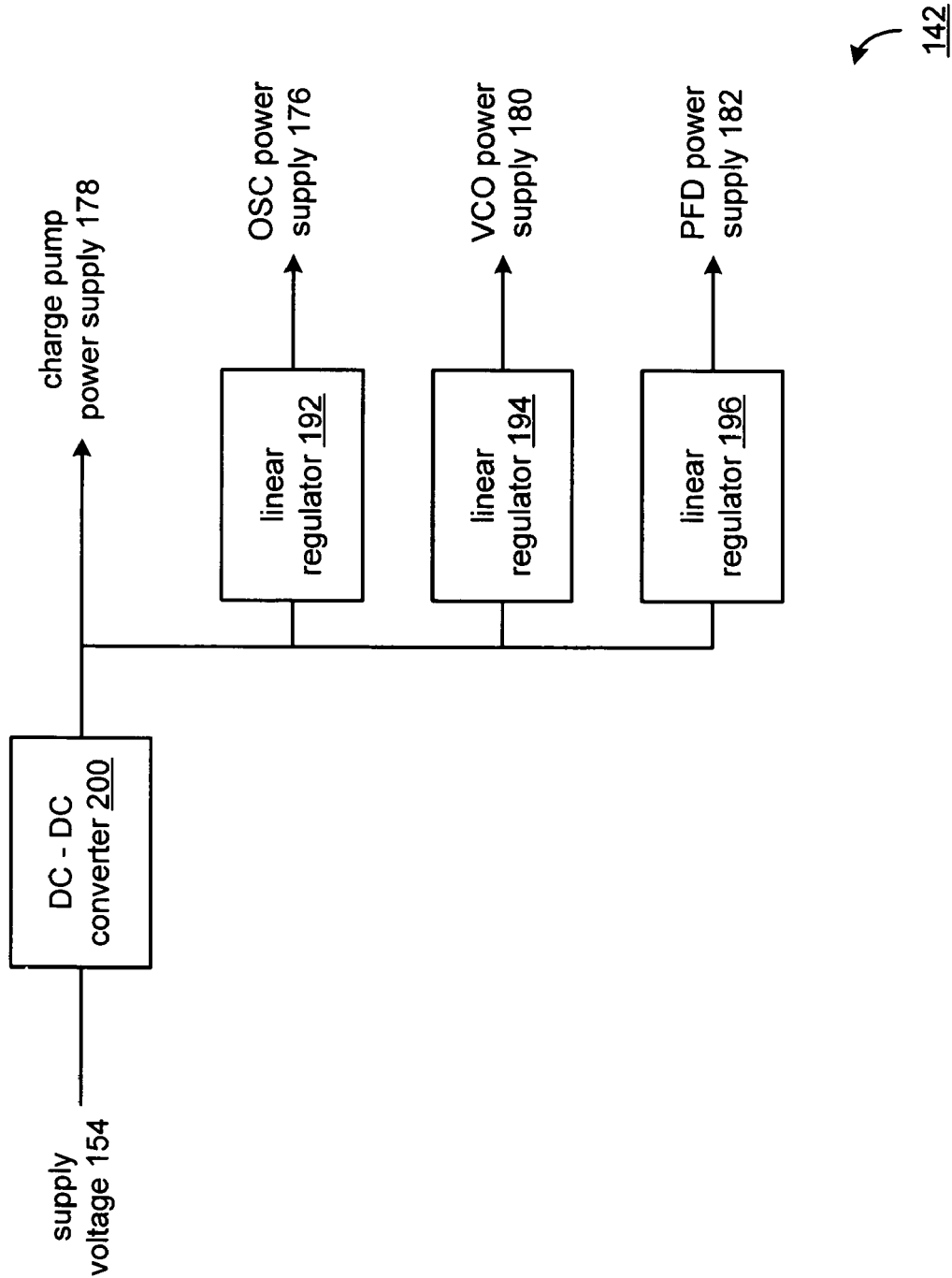
FIG. 7 is a schematic block diagram of another embodiment of a power distribution module in accordance with the present invention.

FIG. 7 is a schematic block diagram of an alternate embodiment of the power distribution module 142. In this embodiment, the power distribution module 142 includes a DC-to-DC converter 200 and a plurality of linear regulators 192-196. In this embodiment, the DC-to-DC converter 200 converts the supply voltage 154 into the individual supply voltage 176. From individual voltage 176, the linear regulators 192-196 are powered to produce their corresponding individual supply voltages 178-182.

As one of ordinary skill in the art will appreciate, the DC-to-DC converter 200 may be a boost converter such that the individual supply voltage 176 is greater than the supply voltage 154 or may be a buck converter where the individual supply voltage 176 is less than the supply voltage 154. As one of ordinary skill in the art will further appreciate, linear regulators 192-196 may be powered from the individual supply voltage 176 or the supply voltage 154.

Figure 8:
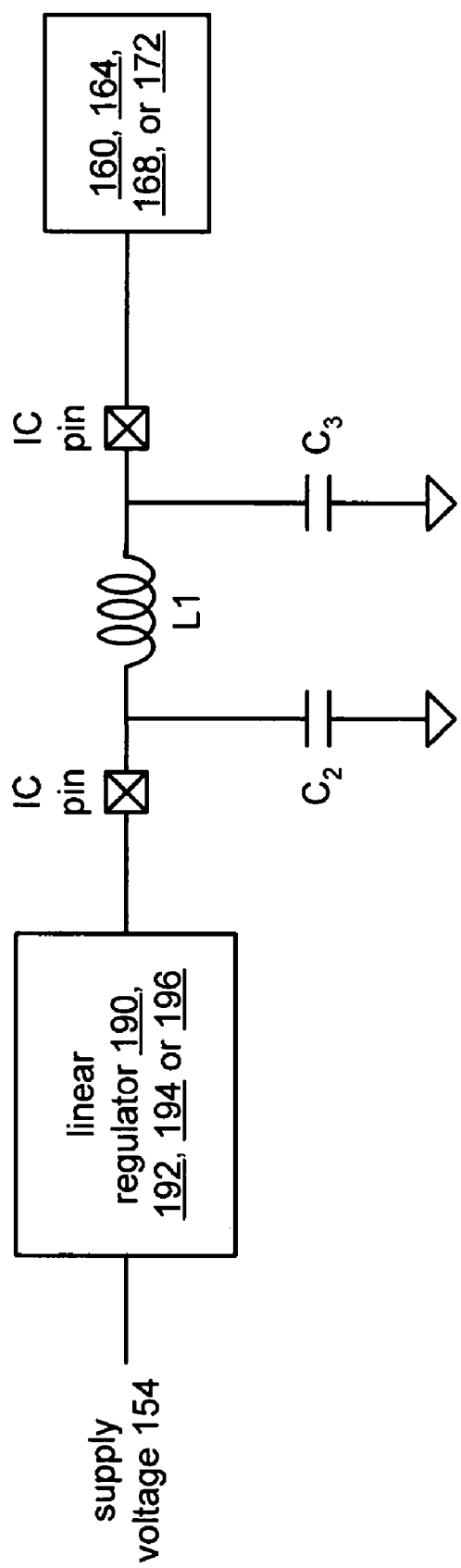
FIG. 8 is a schematic block diagram of integrated circuit coupling of a phase locked loop in accordance with the present invention.

FIG. 8 is a schematic block diagram of an embodiment for coupling the individual power supplies to the corresponding components of the phase locked loop. As shown, the linear regulators 190, 192, 194 and/or 196 are on-chip and produce the individual output at a first integrated circuit pin. The components of the phase locked loop, which include the crystal oscillation module 160, the phase and frequency detector 164, the charge pump 168 and/or the VCO 172, have their power supply input coupled to a second integrated circuit pin. The first and second integrated circuit pins are coupled off-chip via a filter. In this illustration, the filter is a bandpass filter comprising an inductor L1 and a pair of capacitors C2 and C3. As one of ordinary skill in the art will appreciate, the filter may be a high pass filter, a low pass filter, a stop band filter, and/or a bandpass of various constructs and the inductor L1 may be replaced with a resistor.

As one of ordinary skill in the art will appreciate, the term "substantially" or "approximately", as may be used herein, provides an industry-accepted tolerance to its corresponding term and/or relativity between items. Such an industry-accepted tolerance ranges from less than one percent to twenty percent and corresponds to, but is not limited to, component values, integrated circuit process variations, temperature variations, rise and fall times, and/or thermal noise. Such relativity between items ranges from a difference of a few percent to magnitude differences. As one of ordinary skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of ordinary skill in the art will also appreciate, inferred coupling (i.e., where one element is coupled to another element by inference) includes direct and indirect coupling between two elements in the same manner as "operably coupled". As one of ordinary skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

While the transistors in the above described figure(s) is/are shown as field effect transistors (FETs), as one of ordinary skill in the art will appreciate, the transistors may be implemented using any type of transistor structure including, but not limited to, bipolar, metal oxide semiconductor field effect transistors (MOSFET), N-well transistors, P-well transistors, enhancement mode, depletion mode, and zero voltage threshold (VT) transistors.

The preceding discussion has presented a phase locked loop with power distribution that reduces noise generated by the phase locked loop. By reducing noise within the phase locked loop, the phase locked loop may be used within a local oscillation generator to reduce noise therein. As one of ordinary skill in the art will appreciate, other embodiments may be derived from the teaching of the present invention without deviating from the scope of the claims.

What is claimed is:
1. A phase locked loop comprises:
a detection module operably coupled to produce a difference signal based on a difference between a reference oscillation and a feedback oscillation;
control conversion module operably coupled to convert the difference signal into a control signal;
controlled oscillation module operably coupled to produce an output oscillation based on the control signal;
a divider module operably coupled to produce the feedback oscillation based on the output oscillation; and
a power distribution module operably coupled to receive a supply voltage and to provide an individual supply voltage to at least one of the detection module, the control conversion module, the controlled oscillation module, and the divider module to optimize at least one of performance and power consumption of the phase locked loop.

2. The phase locked loop of claim 1 further comprises:
a crystal oscillation module operably coupled to a crystal oscillator to generate the reference oscillation, wherein the power distribution module produces an oscillation power supply from the supply voltage and provides the oscillation power supply voltage to the crystal oscillation module.

3. The phase locked loop of claim 1, wherein the control conversion module comprises:
a charge pump module operably coupled to convert the difference signal into an up-current when the difference signal represents the reference oscillation having a phase or frequency leading phase or frequency of the feedback oscillation and to convert the difference signal into a down-current when the difference signal represents the reference oscillation having the phase or frequency lagging the phase or frequency of the feedback oscillation, wherein the power distribution module produces a charge pump power supply voltage from the supply voltage; and
a loop filter operably coupled to convert the up-current and the down-current into the control signal.

4. The phase locked loop of claim 1 further comprises:
the detection module including a phase and frequency detection module; and
the power distribution module produces a phase and frequency detection power supply voltage from the supply voltage, wherein the phase and frequency detection module is powered via the phase and frequency detection power supply voltage.

5. The phase locked loop of claim 1, wherein the controlled oscillation module comprises:
a voltage controlled oscillator operably coupled to convert the control signal into the output oscillation, wherein the power distribution module produces a voltage controlled oscillator power supply voltage from the supply voltage.

6. The phase locked loop of claim 1, wherein the power distribution module comprises:
at least one linear regulator to produce the individual supply voltage.

7. The phase locked loop of claim 1, wherein the power distribution module comprises:
a DC-DC converter to convert the supply voltage to a second supply voltage;
a first linear regulator operably coupled to the produce the individual supply voltage from the second supply voltage or the supply voltage; and
a second linear regulator operably coupled to produce a second individual supply voltage from the second supply voltage.

8. A local oscillation generator comprises:
a phase locked loop operably coupled to produce an output oscillation from a reference oscillation; and
oscillation adjustment module operably coupled to convert the output oscillation into a local oscillation, wherein the phase locked loop includes:
a detection module operably coupled to produce a difference signal based on a difference between the reference oscillation and a feedback oscillation;
control conversion module operably coupled to convert the difference signal into a control signal;
controlled oscillation module operably coupled to produce the output oscillation based on the control signal;
a divider module operably coupled to produce the feedback oscillation based on the output oscillation; and
a power distribution module operably coupled to receive a supply voltage and to provide an individual supply voltage to at least one of the detection module, the control conversion module, the controlled oscillation module, and the divider module to optimize at least one of performance and power consumption of the phase locked loop.

9. The local oscillation generator of claim 8, wherein the phase locked loop further comprises:
a crystal oscillation module operably coupled to a crystal oscillator to generate the reference oscillation, wherein the power distribution module produces an oscillation power supply from the supply voltage and provides the oscillation power supply voltage to the crystal oscillation module.

10. The local oscillation generator of claim 8, wherein the control conversion module comprises:
a charge pump module operably coupled to convert the difference signal into an up-current when the difference signal represents the reference oscillation having a phase or frequency leading phase or frequency of the feedback oscillation and to convert the difference signal into a down-current when the difference signal represents the reference oscillation having the phase or frequency lagging the phase or frequency of the feedback oscillation, wherein the power distribution module produces a charge pump power supply voltage from the supply voltage; and
a loop filter operably coupled to convert the up-current and the down-current into the control signal.

11. The local oscillation generator of claim 8, wherein the controlled oscillation module comprises:
a voltage controlled oscillator operably coupled to convert the control signal into the output oscillation, wherein the power distribution module produces a voltage controlled oscillator power supply voltage from the supply voltage.

12. The local oscillation generator of claim 8, wherein the power distribution module comprises:
at least one linear regulator to produce the individual supply voltage.

13. The local oscillation generator of claim 8, wherein the power distribution module comprises:
a DC-DC converter to convert the supply voltage to a second supply voltage;
a first linear regulator operably coupled to the produce the individual supply voltage from the second supply voltage or the supply voltage; and
a second linear regulator operably coupled to produce a second individual supply voltage from the second supply voltage.

14. A radio frequency (RF) transceiver comprises:
an RF transmitter section operably coupled to convert outbound baseband signals into outbound RF signals based on a transmit local oscillation;
an RF receiver section operably coupled to convert inbound RF signals into inbound baseband signals based on a receive local oscillation; and a local oscillation generator operably coupled to produce the transmit local oscillation and the receive local oscillation, wherein the local oscillation generator includes:
  a phase locked loop operably coupled to produce an output oscillation from a reference oscillation; and
  oscillation adjustment module operably coupled to convert the output oscillation into the transmit and receive local oscillations, wherein the phase locked loop includes:
    a detection module operably coupled to produce a difference signal based on a difference between the reference oscillation and a feedback oscillation;
    control conversion module operably coupled to convert the difference signal into a control signal;
    controlled oscillation module operably coupled to produce the output oscillation based on the control signal;
    a divider module operably coupled to produce the feedback oscillation based on the output oscillation; and
    a power distribution module operably coupled to receive a supply voltage and to provide an individual supply voltage to at least one of the detection module, the control conversion module, the controlled oscillation module, and the divider module to optimize at least one of performance and power consumption of the phase locked loop.

15. The RF transceiver of claim 14, wherein the phase locked loop further comprises:
  a crystal oscillation module operably coupled to a crystal oscillator to generate the reference oscillation, wherein the power distribution module produces an oscillation power supply from the supply voltage and provides the oscillation power supply voltage to the crystal oscillation module.

16. The RF transceiver of claim 14, wherein the control conversion module comprises:
  a charge pump module operably coupled to convert the difference signal into an up-current when the difference signal represents the reference oscillation having a phase or frequency leading phase or frequency of the feedback oscillation and to convert the difference signal into a down-current when the difference signal represents the reference oscillation having the phase or frequency lagging the phase or frequency of the feedback oscillation, wherein the power distribution module produces a charge pump power supply voltage from the supply voltage; and
  a loop filter operably coupled to convert the up-current and the down-current into the control signal.

17. The RF transceiver of claim 14, wherein the controlled oscillation module comprises:
  a voltage controlled oscillator operably coupled to convert the control signal into the output oscillation, wherein the power distribution module produces a voltage controlled oscillator power supply voltage from the supply voltage.

18. The RF transceiver of claim 14, wherein the power distribution module comprises:
  at least one linear regulator to produce the individual supply voltage.

19. The RF transceiver of claim 14, wherein the power distribution module comprises:
  a DC-DC converter to convert the supply voltage to a second supply voltage;
  a first linear regulator operably coupled to the produce the individual supply voltage from the second supply voltage or the supply voltage; and
  a second linear regulator operably coupled to produce a second individual supply voltage from the second supply voltage.

* * * * *